United States Patent
Lin et al.

(10) Patent No.: US 7,509,997 B2
(45) Date of Patent: Mar. 31, 2009

(54) HEAT SINK

(75) Inventors: Yu-Chen Lin, Tu-Cheng (TW);
Hong-Bo Xu, Shenzhen (CN)

(73) Assignees: Hong Fu Jin Precision Industry (ShenZhen) Co., Ltd., Shenzhen City, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,532

(22) Filed: Aug. 18, 2006

(65) Prior Publication Data

US 2007/0246189 A1    Oct. 25, 2007

(30) Foreign Application Priority Data

Apr. 19, 2006    (CN) .................. 2006 1 0060402

(51) Int. Cl.
*F28F 7/00* (2006.01)
*H05K 7/20* (2006.01)

(52) U.S. Cl. ............... 165/80.3; 165/185; 165/104.34

(58) Field of Classification Search ............. 165/185, 165/80.3, 104.34; 361/690, 697, 703, 709–710; 174/16.3
See application file for complete search history.

(56) References Cited

U.S. PATENT DOCUMENTS

| | | | | |
|---|---|---|---|---|
| 4,823,869 A | * | 4/1989 | Arnold et al. | 165/185 |
| 5,486,980 A | * | 1/1996 | Jordan et al. | 361/697 |
| 5,677,829 A | * | 10/1997 | Clemens | 361/697 |
| 6,310,774 B1 | | 10/2001 | Lee | |
| 6,450,249 B1 | * | 9/2002 | Liu | 165/80.3 |
| 6,507,491 B1 | * | 1/2003 | Chen | 361/697 |
| 6,557,625 B1 | * | 5/2003 | Ma | 165/80.2 |
| 6,640,884 B1 | * | 11/2003 | Liu | 165/80.3 |
| 7,172,017 B2 | * | 2/2007 | Tan et al. | 165/185 |
| 2002/0079086 A1 | * | 6/2002 | Huang et al. | 165/80.3 |
| 2007/0047206 A1 | * | 3/2007 | Lee et al. | 361/703 |

FOREIGN PATENT DOCUMENTS

| | | |
|---|---|---|
| CN | 2489467 Y | 5/2002 |
| CN | 2525677 Y | 12/2002 |

* cited by examiner

*Primary Examiner*—Tho v Duong
(74) *Attorney, Agent, or Firm*—Frank R. Niranjan

(57) ABSTRACT

A heat sink includes a first array of fins defining a plurality of first channels therebetween, a second array of fins disposed at opposite sides of the first array of fins, and a plurality of grooves extending through the first array of fins and the second array of fins. The second array of fins defines a plurality of second channels therebetween. The grooves are intersected with the first channels and the second channels. A bottom extremity of each groove has a curved shape facing upwardly and laterally. A portion of an airflow generated by a fan mounted on a top of the heat sink flows laterally and downwardly through the grooves to leave the heat sink.

4 Claims, 3 Drawing Sheets

HEAT SINK

FIELD OF THE INVENTION

The present invention relates to a heat sink, and more particularly to a heat sink for removing heat from an electronic package and dissipating the heat to ambient air.

DESCRIPTION OF RELATED ART

A heat sink is usually placed in thermal contact with an electronic package, such as a central processing unit (CPU), to transfer heat through conduction away from the electronic package, thus preventing over-heating of the electronic package.

Generally, a heat sink comprises a base contacting the electronic package for absorbing heat from the electronic package, and a plurality of fins extending perpendicularly from the base to dissipate the heat deriving from the electronic package. A fan is mounted onto the heat sink to facilitate air convection in the heat sink to enhance the heat dissipation efficiency of the heat sink. However, airflow resistance makes most of current heat sinks difficult to efficiently remove heat from the electronic packages which generate a great deal of heat during operation.

Therefore, an improved a heat sink, which overcomes the above-mentioned problem is desired.

SUMMARY OF THE INVENTION

A heat sink in accordance with a preferred embodiment of the present invention comprises a first array of fins defining a plurality of first channels therebetween, a second array of fins disposed at opposite sides of the first array of fins, and a plurality of grooves extending through the first array of fins and the second array of fins. The second array of fins defines a plurality of second channels therebetween. The grooves are intersected with the first channels and the second channels and formed by cutting away upper portions of the first array of fins and the second array of fins. The groove has a depth gradually increased from a center toward a lateral side of the heat sink. A bottom extremity of the groove forms a concave facing an upper, lateral side of the heat sink. When a fan mounted on a top of the heat sink is operated, a portion of an airflow generated by the fan flows curvedly along the grooves to leave the heat sink laterally, thereby taking heat away from the heat sink.

Other advantages and novel features will become more apparent from the following detailed description of preferred embodiments when taken in conjunction with the accompanying drawings, in which:

BRIEF DESCRIPTION OF THE DRAWINGS

Many aspects of the heat sink can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION OF THE INVENTION

Figure 1:
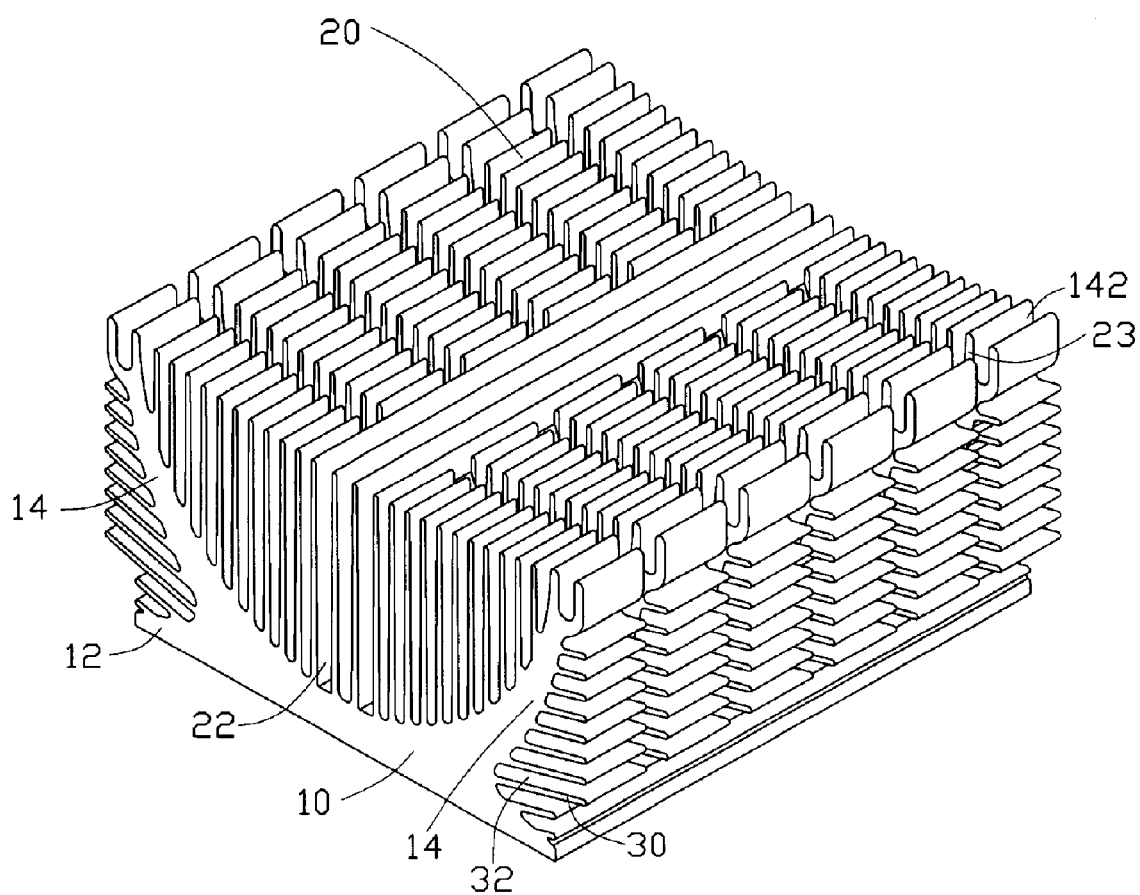
FIG. 1 is an isometric view of a heat sink in accordance with a preferred embodiment of the present invention.
Figure 2:
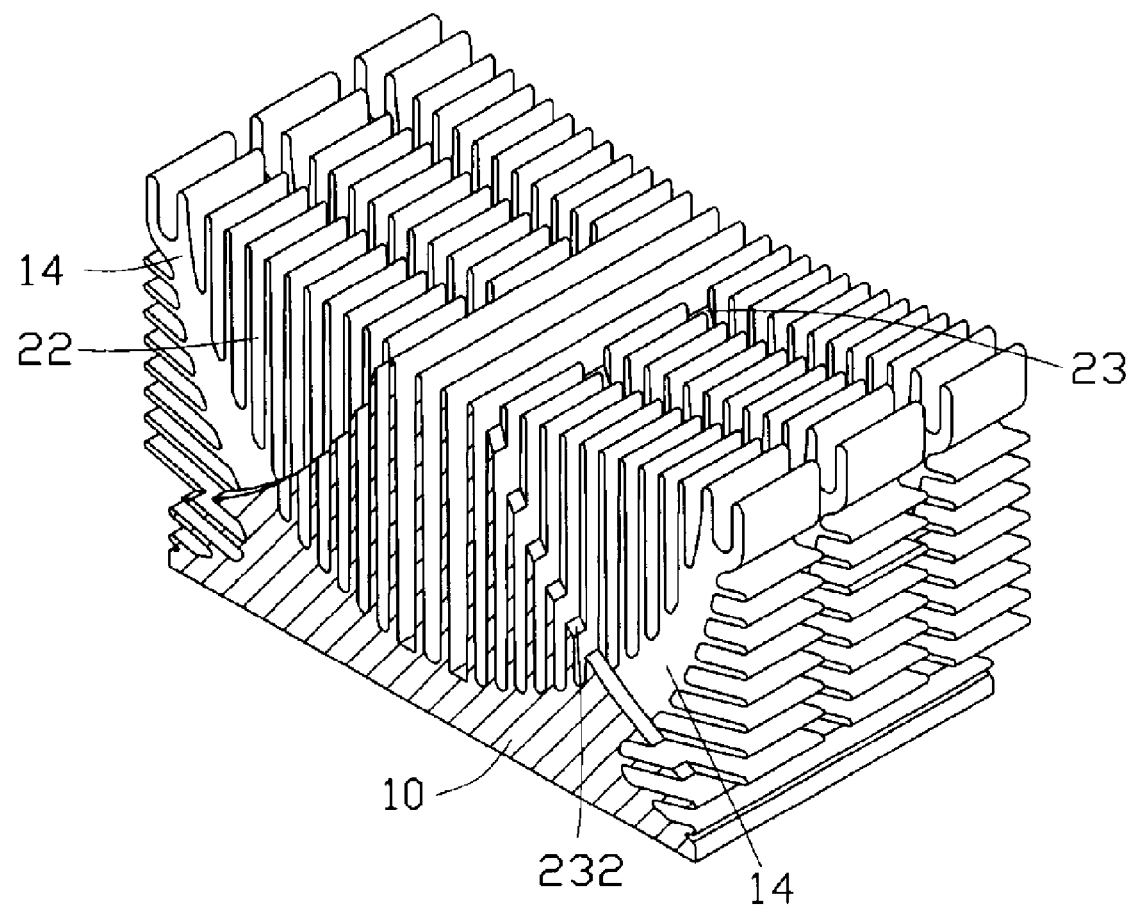
FIG. 2 is a cross-sectional view of the heat sink of FIG. 1.
Figure 3:
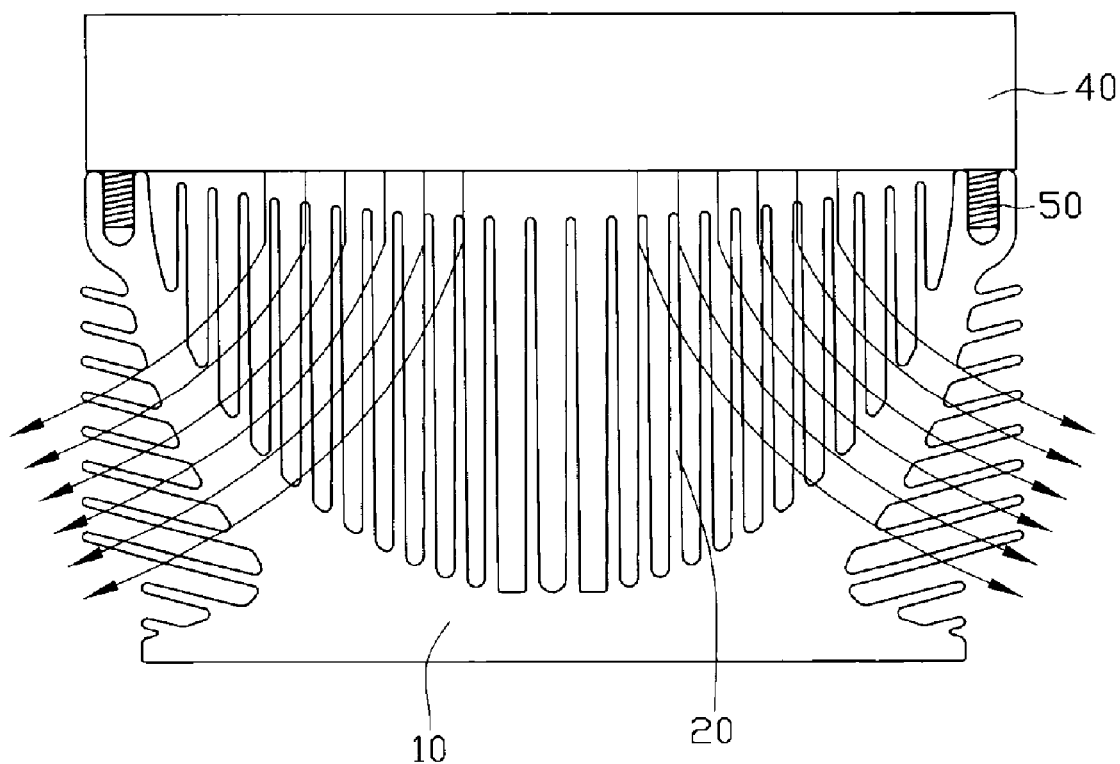
FIG. 3 is an elevation side view of the heat sink of FIG. 1, showing airflow direction in the heat sink when a fan is mounted on the heat sink.

Referring to FIGS. 1-3, a heat sink in accordance with a preferred embodiment of the present invention is illustrated. The heat sink is used to remove heat from a heat source (not shown), such as a Central Processing Unit, a chip set, etc.

The heat sink is made of a heat conductive material, such as copper, aluminum, etc. In the preferred embodiment, the heat sink is formed first by aluminum alloy extrusion and then machining. The heat sink comprises a solid base 10 adapted for contacting a surface of the heat source, a plurality of vertical fins 20 and a plurality of lateral fins 30. The base 10 is used to absorb heat generated by the heat source. The fins 20, 30 are used to dissipate the heat to ambient air.

The base 10 comprises a flat substrate 12 having a flat bottom surface to contact the heat source and a pair of wings 14. The wings 14 are respectively extend upwardly and outwardly from a center of the substrate 12 to render the wings 14 to have a substantially arc-shaped profile in the preferred embodiment. Although not shown in this embodiment, the wings 14 can also be rendered with a substantially V-shaped profile. Each wing 14 defines an elongated slot 142 at a distal end thereof. The slot 142 extends from a front side of the heat sink to a rear side of the heat sink. The slots 142 facilitate to mount a fan 40 on the heat sink, for example, by extending screws 50 through the fan 40 to engage in the slots 142.

The vertical fins 20 are extended upwardly from an upper side of the wings 14, and located between the wings 14. The vertical fins 20 are parallelly arranged from a left side of the heat sink to a right side of the heat sink. Top terminations of the vertical fins 20 corporately define a surface which is slightly concave toward a center of the heat sink. The lateral fins 30 are extended outwardly from lateral sides of the base 10, and located between the substrate 12 and the wings 14. The lateral fins 30 are angled with the vertical fins 20 in the preferred embodiment, as clearly shown in FIG. 3.

A plurality of vertical channels 22 for air flowing from a top toward a bottom of the heat sink are defined between the vertical fins 20. A plurality of channels 32 for air flowing in a substantially horizontal direction are defined between the lateral fins 30. The vertical channels 22 and the horizontal channels 32 are all extended from the front side of the heat sink to the rear side of the heat sink. A plurality of pairs of grooves 23 are defined in the heat sink, perpendicularly intersected with the channels 22, 32 except several midmost vertical channels 22 in the preferred embodiment. That is, the grooves 23 are defined at opposite lateral portions of the heat sink. The grooves 23 of each pair of the grooves 23 are in line with each other along a traverse direction of the heat sink. The grooves 23 are separated at a uniform interval along a front-to-back direction. As clearly shown in FIG. 2, the grooves 23 each are defined by cutting away upper portions of the vertical fins 20 except four midmost vertical fins 20, the wings 14 and the lateral fins 30 of the heat sink. Each of the grooves 23 has a depth gradually increased from the center of the heat sink towards the lateral sides of the heat sink. Such a design of the grooves 23 renders a cross section of the heat sink at a place where one of the pairs of the grooves 23 is defined to have a substantially trapeziform configuration. In the preferred embodiment as shown in FIG. 2, bottom extremities 232 of each pair of the grooves 23 form two concaves each facing a corresponding upper, lateral side of the heat sink. When the fan 40 is operated, a portion (not shown) of an airflow generated by the fan 40 flows directly downwardly along the vertical channels 22 to reach a top surface of the wings 14 and then flows forwardly and rearwards to leave the heat sink, thereby taking the heat away therefrom. Another portion of the airflow is indicated by arrows of FIG. 3, which flows curvedly along the grooves 23 to leave the heat sink laterally, thereby taking the heat away from the heat sink.

It is believed that the present embodiment and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink assembly comprising:
   a heat sink defining a plurality of airflow channels extending through front and rear ends of the heat sink and a plurality of airflow grooves intersected with the airflow channels; and
   a fan mounted on a top side of the heat sink and blowing an airflow into the channels and the grooves of the heat sink;
   wherein a cross section of the heat sink has a substantially trapeziform configuration at which the grooves are defined, a part of the airflow flows through the channels to leave the heat sink via the front and rear ends thereof, and another part of the airflow flows through the grooves to leave the heat sink via lateral sides thereof;
   wherein the heat sink comprises a substrate and two wings extending outwardly and upwardly from a top of the substrate;
   wherein a plurality of first fins are disposed between the wings, and a plurality of second fins are disposed between the substrate and the wings, and wherein a part of the airflow channels is defined between the first fins and another part of the airflow channels is defined between the second fins; and
   wherein the grooves each are defined by cutting away upper portions of the first fins except midmost ones thereof, the wings and the second fins, the grooves each having a gradually increased depth from a middle of the heat sink towards a lateral side of the heat sink.

2. The heat sink assembly as claimed in claim 1, wherein each of the grooves has a bottom extremity with a arc-shaped configuration.

3. The heat sink assembly as claimed in claim 1, wherein the grooves are defined at opposite lateral portions of the heat sink.

4. The heat sink assembly as claimed in claim 2, wherein the arc-shaped configuration is a concave facing a upper, lateral side of the heat sink.

* * * * *